(12) United States Patent
Lee et al.

(10) Patent No.: US 7,612,360 B2
(45) Date of Patent: Nov. 3, 2009

(54) NON-VOLATILE MEMORY DEVICES HAVING CELL DIODES

(75) Inventors: Kwang-woo Lee, Jeollabuk-do (KR); Jae-hee Oh, Gyeonggi-do (KR); Chang-wook Jeong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 153 days.

(21) Appl. No.: 11/782,682

(22) Filed: Jul. 25, 2007

(65) Prior Publication Data

US 2008/0111120 A1 May 15, 2008

(30) Foreign Application Priority Data

Nov. 13, 2006 (KR) ................ 10-2006-0111721

(51) Int. Cl.
*H01L 29/04* (2006.01)
(52) U.S. Cl. .............. 257/3; 257/E45.002; 365/148
(58) Field of Classification Search .......... 257/1–4, 257/E45.002; 365/105, 148, 175
See application file for complete search history.

(56) References Cited

U.S. PATENT DOCUMENTS 6,744,088 B1    6/2004  Dennison 6,912,153 B2 *  6/2005  Tihanyi ...................... 365/158
2004/0036103 A1  2/2004  Chen et al.

FOREIGN PATENT DOCUMENTS

KR      1020060001060 A      1/2006

* cited by examiner

*Primary Examiner*—Jerome Jackson, Jr.
*Assistant Examiner*—Paul A Budd
(74) *Attorney, Agent, or Firm*—Myers Bigel Sibley & Sajovec

(57) ABSTRACT

An integrated circuit memory cell includes a substrate having a first semiconductor region of first conductivity type (e.g., N-type) therein, which may define a portion of a word line within the substrate. An electrically insulating layer is provided on the substrate. The electrically insulating layer has an opening therein that extends opposite a recess in the first semiconductor region. A first insulating spacer is provided on a sidewall of the recess in the first semiconductor region. A diode is provided in the opening. The diode has a first terminal electrically coupled to a bottom of the recess in the first semiconductor region. A variable resistivity material region (e.g., phase-changeable material region) is also provided. The variable resistivity material region is electrically coupled to a second terminal of the diode.

18 Claims, 13 Drawing Sheets

NON-VOLATILE MEMORY DEVICES HAVING CELL DIODES

REFERENCE TO PRIORITY APPLICATION

This application claims the benefit of Korean Application No. 2006-111721, filed Nov. 13, 2006, the disclosure of which is hereby incorporated herein by reference.

FIELD OF THE INVENTION

The present invention relates to semiconductor memory devices and methods of fabricating same and, more particularly, to non-volatile memory devices and methods of fabricating same.

BACKGROUND OF THE INVENTION

A phase-changeable memory device is a nonvolatile memory device that works by exploiting a resistance difference that occurs in response to a phase change of a phase-changeable material. In such a phase-changeable memory device, a unit cell includes one switching device and a phase-changeable resistor electrically connected to the switching device. The phase-changeable resistor includes an upper electrode, a lower electrode, and a phase-changeable material layer disposed between the upper and lower electrodes.

The switching device may be a metal-oxide-semiconductor (MOS) transistor. In this case, programming of the unit cell of the phase-changeable memory device requires a high program current of at least several mA. This limits a reduction in an area of the MOS transistor, which conducts the program current. In other words, the use of the MOS transistor as the switching device restricts the integration density of the phase-changeable memory device.

To solve this problem, a vertical diode may be used as the cell-switching device instead of the MOS transistor. A phase-change memory device with a vertical diode is disclosed by Chen et al. in U.S. Patent Publication No. 2004/0036103, entitled "Memory Device and Method of Manufacturing the Same." Chen et al. describes a device in which an n-type doping layer is formed on a p-type semiconductor substrate, an insulating layer is formed on the n-type doping layer, a plug is formed in the insulating layer, an n-type dopant is doped in the entire region of the plug, the upper portion of the plug, which is doped with an n-type dopant, is doped with a p-type dopant, and a phase-changeable resistor is formed on the plug.

In such a phase-changeable memory device, a parasitic bipolar junction transistor may be created between adjacent cells. In particular, a p-type doping layer that is an upper region of the plug, an n-type doping layer that is a lower region of the plug, an n-type doping layer on the substrate, an n-type doping layer that is a lower region of an adjacent plug, and a p-type doping layer that is an upper region of the adjacent plug may form a p-n-p-type bipolar junction transistor. The transistor may cause electrical disturbance between adjacent cells when the phase-changeable memory device is active.

SUMMARY OF THE INVENTION

Embodiments of the present invention include a non-volatile integrated circuit memory cell having a variable resistivity material region therein that can be programmed. These memory cells include a substrate having a first semiconductor region of first conductivity type therein and an electrically insulating layer on the substrate. The electrically insulating layer has an opening therein that extends opposite a recess in the first semiconductor region. A first insulating spacer is provided on a sidewall of the recess in the first semiconductor region and a diode is provided in the opening. The diode has a first terminal that is electrically coupled to a bottom of the recess in the first semiconductor region and a second terminal that is electrically coupled to the variable resistivity material region. In some of these embodiments of the present invention, the variable resistivity material region may be phase-changeable material region and the first semiconductor region may be a configured as a word line. The phase-changeable material region may be a chalcogenide composition.

According to additional embodiments of the present invention, the electrically insulating layer and said first insulating spacer are formed of different dielectric materials. The diode may also be a P-N junction diode having a cathode of first conductivity type (e.g., N-type or P-type) electrically coupled to the first semiconductor region and an anode of second conductivity type (e.g., P-type or N-type) electrically coupled to the variable resistivity material region. In particular, the cathode may form a non-rectifying semiconductor junction with the bottom of the recess in the first semiconductor region. An electrode may also be provided in the opening, between the anode and the variable resistivity material region.

BRIEF DESCRIPTION OF THE DRAWINGS

The above and other features and advantages of embodiments of the present invention will become more apparent by describing in detail exemplary embodiments thereof with reference to the attached drawings in which.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. Like numbers refer to like elements throughout the specification.

Figure 1:
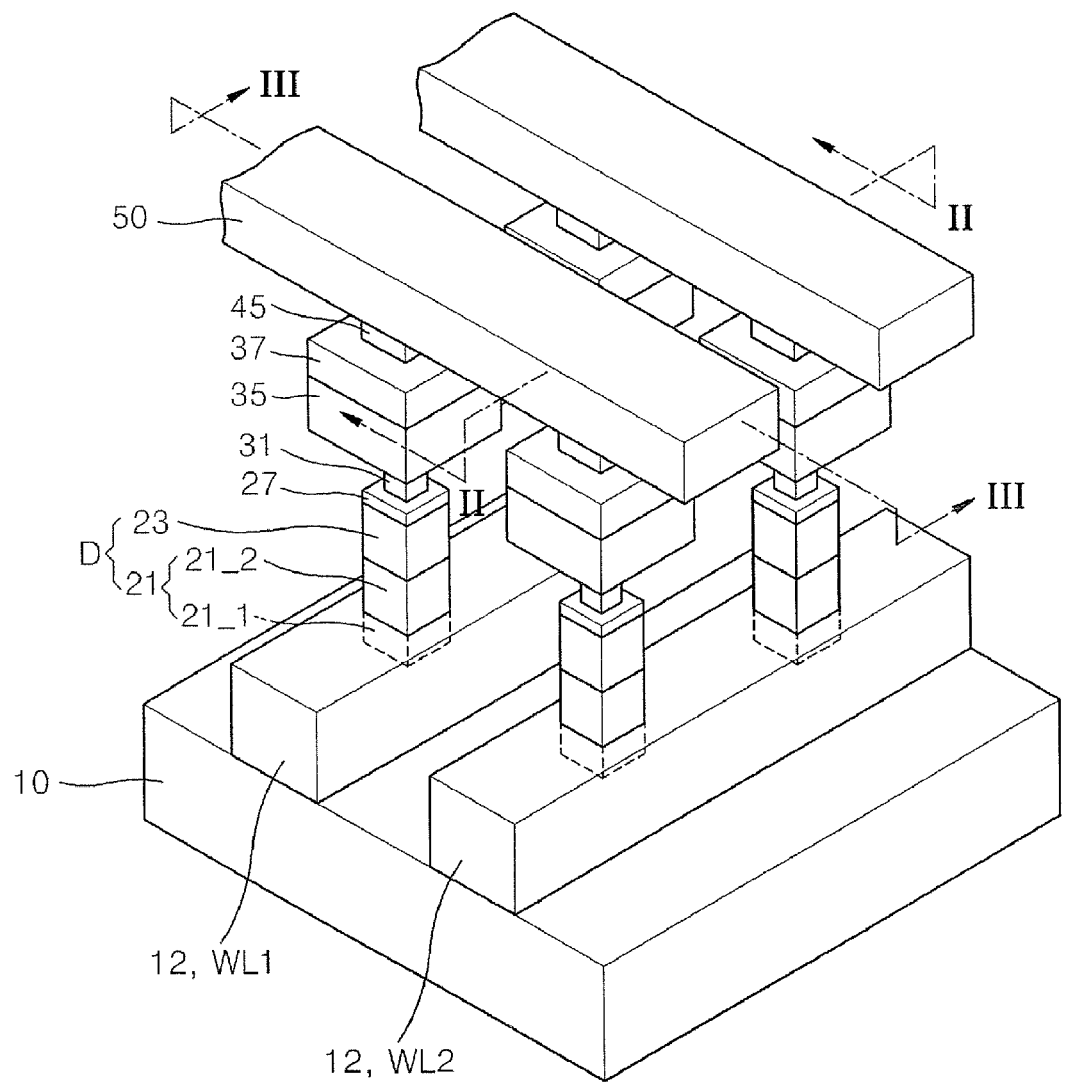
FIG. 1 is a perspective view illustrating a portion of a cell array region of a phase-changeable memory device, according to embodiments of the present invention.

FIG. 1 is a perspective view illustrating a portion of a cell array region of a phase-change memory device according to an embodiment of the present invention. FIGS. 2A through 2G and FIGS. 3A through 3G are cross-sectional views illustrating a method of fabricating a phase-change memory device according to an embodiment of the present invention. FIGS. 2A through 2G are cross-sectional views taken along line II-II of FIG. 1 and FIGS. 3A through 3G are cross-sectional views taken along line III-III of FIG. 1.

Figure 2A:
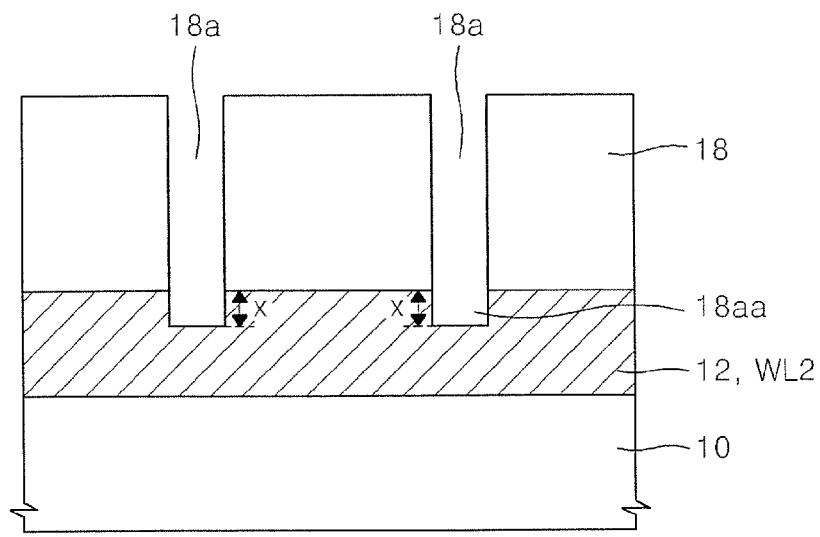
FIGS. 2A through 2G are cross-sectional views taken along line II-II of FIG. 1, illustrating a method of fabricating a phase-changeable memory device, according to an embodiment of the present invention.
Figure 3A:
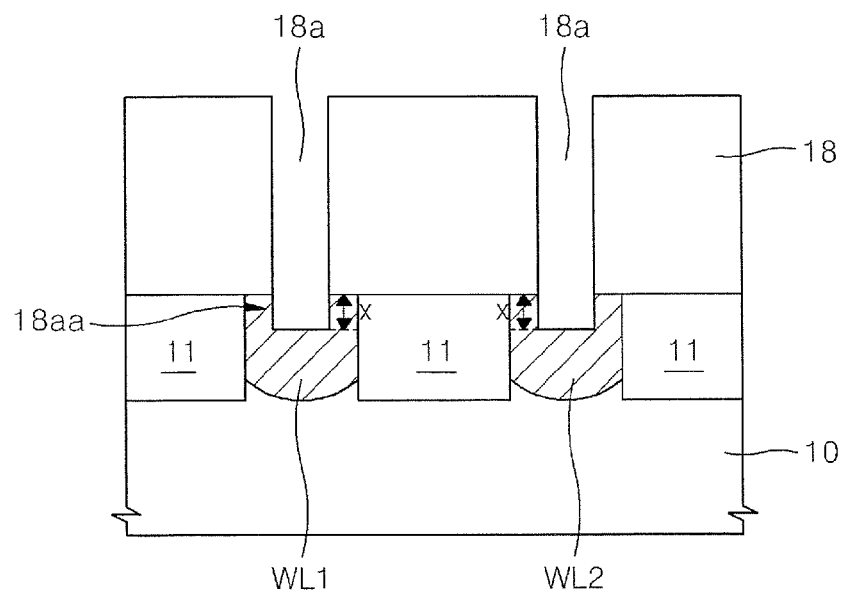
FIGS. 3A through 3G are cross-sectional views taken along line III-III of FIG. 1, illustrating a method of fabricating a phase-changeable memory device, according to an embodiment of the present invention.

Referring to FIGS. 1, 2A and 3A, an isolation region 11a is formed in a predetermined region of a semiconductor substrate 10 to define a plurality of active regions 12. The plurality of active regions 12 may be parallel with each other. The active regions 12 may be doped with dopants having a different conductivity type from that of the semiconductor substrate 10 to thereby form first signal lines (i.e., first and second word lines WL1 and WL2). Accordingly, the word lines WL1 and WL2 may be first-type impurity regions having a first conductivity type, and the semiconductor substrate 10 may have a second conductivity type opposite to the first conductivity type. For example, when the semiconductor substrate 10 is a p-type semiconductor substrate, the word lines WL1 and WL2 may be n-type impurity regions.

The word lines WL1 and WL2 may be formed using various other methods, according to additional embodiments of the invention. For example, the word lines WL1 and WL2 may be formed by forming a plurality of parallel epitaxial semiconductor patterns on the semiconductor substrate 10 and implanting impurity ions into the epitaxial semiconductor patterns.

An electrically insulating layer 18 is formed on the substrate having the word lines WL1 and WL2. Specifically, the electrically insulating layer 18 may be formed of a silicon oxide layer or silicon nitride layer. Preferably, the electrically insulating layer 18 may be formed as a silicon oxide layer. A photoresist pattern (not shown) is then formed on the electrically insulating layer 18. The electrically insulating layer 18 is patterned using the photoresist pattern as a mask in order to form cell contact holes 18a exposing predetermined regions of the word lines WL1 and WL2. The cell contact holes 18a extend to upper regions of the word lines WL1 and WL2 by the exposed word lines WL1 and WL2 being recessed. As a result, the cell contact holes 18a pass through the electrically insulating layer 18 and extend to the upper regions of the word lines WL1 and WL2. The upper regions of the word lines WL1 and WL2 into which the cell contact holes 18a extend are defined as recesses 18aa. In this case, internal regions of the word lines WL1 and WL2 are exposed by sidewalls and bottoms of the recesses 18aa. The degree of recessing in the word lines WL1 and WL2 caused by the cell contact hole 18a (i.e., a height X of the recesses 18aa) may be within the range of 500 to 1000 Å.

Figure 2B:
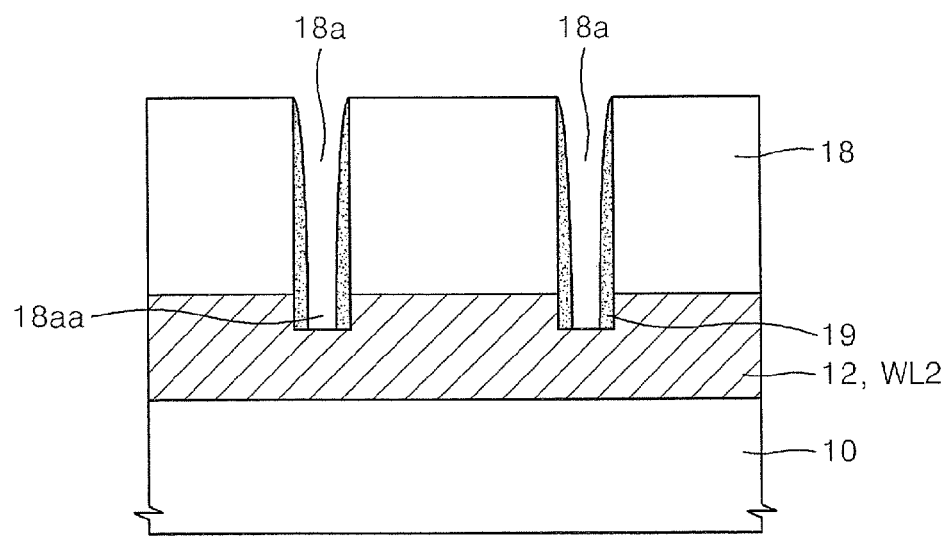
Figure 3B:
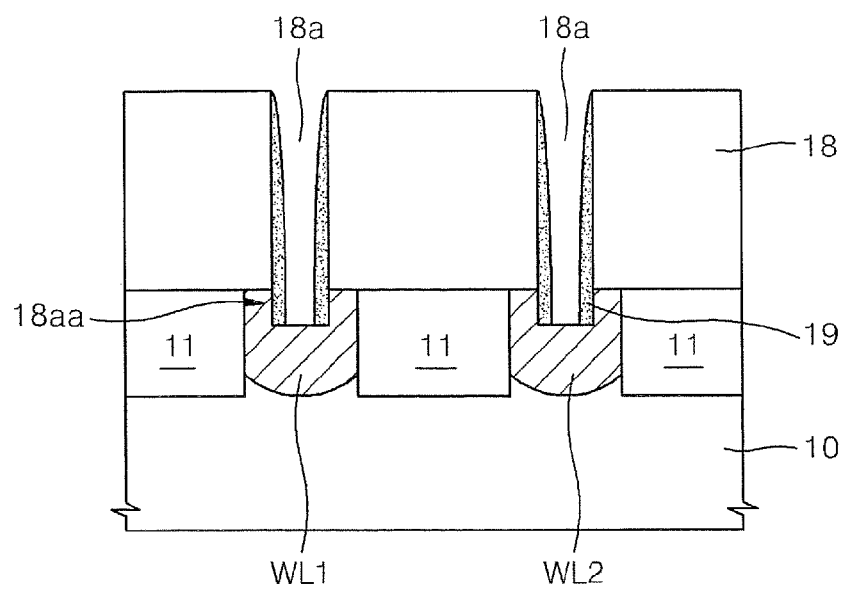

Referring to FIGS. 2B and 3B, sidewall insulating layers 19 are formed on the portions of the word lines WL1 and WL2 exposed by the sidewalls of the cell contact holes 18a (i.e., the sidewalls of the recesses 18aa). Specifically, the sidewall insulating layers 19 are formed by stacking an insulating layer (not shown) on the substrate having the cell contact holes 18a and anisotropically etching it. The sidewall insulating layers 19 may be formed on the portions of the electrically insulating layer 18 exposed by the sidewalls of the cell contact holes 18a, as well as on the portions of the word lines WL1 and WL2 exposed by the sidewalls of the cell contact holes 18a. Each of the sidewall insulating layers 19 may be a silicon oxide layer, a silicon nitride layer or a silicon oxynitride layer. For example, when the electrically insulating layer 18 is a silicon oxide layer, the sidewall insulating layer 19 may be a silicon nitride layer or silicon oxynitride layer, and when the electrically insulating layer 18 is a silicon nitride layer, the sidewall insulating layer 19 may be a silicon oxide layer.

Figure 2C:
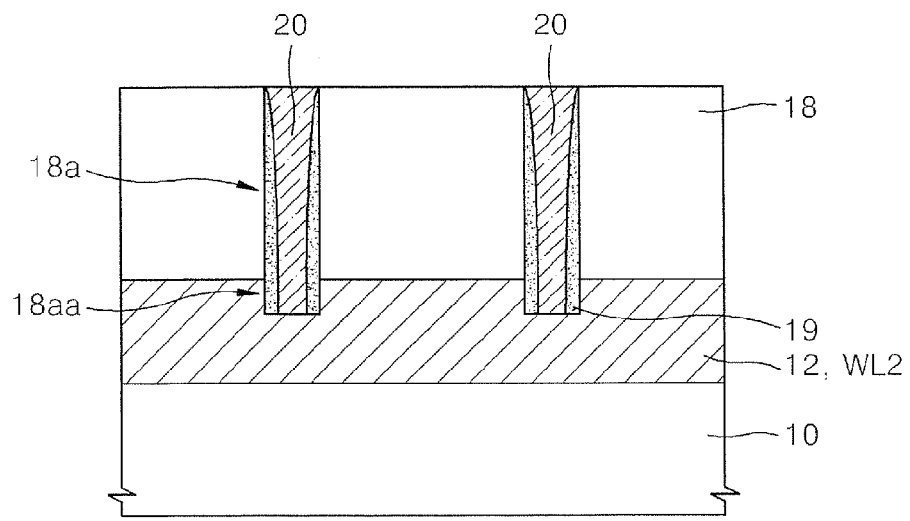
Figure 3C:
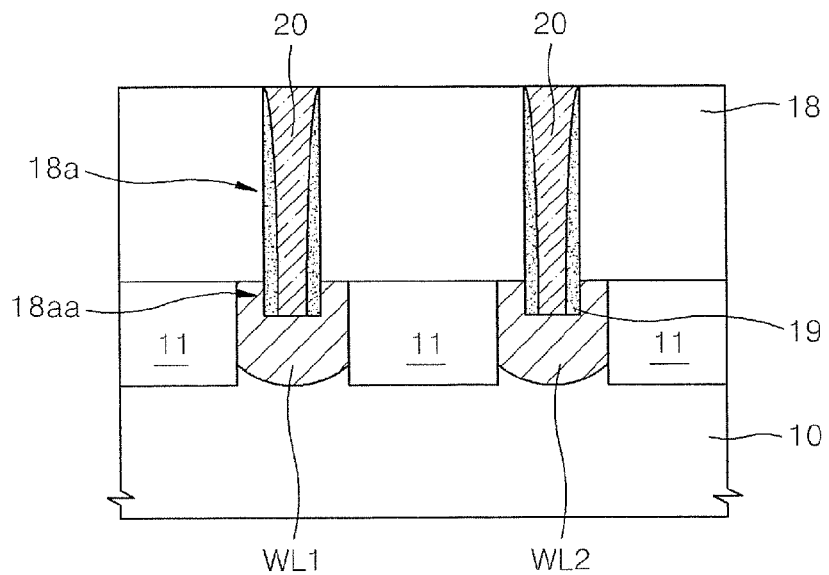

Referring to FIGS. 2C and 3C, semiconductor patterns 20 are formed in the cell contact holes 18a having the sidewall insulating layers 19. The semiconductor patterns 20 may be formed using various other methods. For example, the semiconductor patterns 20 may be formed by a selective epitaxial growth (SEG) method using the exposed portions of the word lines WL1 and WL2 as seed layers. Alternatively, the semiconductor patterns 20 may be formed by forming a semiconductor layer filling the cell contact holes 18a and planarizing the semiconductor layer until the upper surface of the electrically insulating layer 18 is exposed. In this case, the semiconductor layer may include an amorphous semiconductor layer or polycrystalline semiconductor layer. The semiconductor layer may be crystallized by a solid-state epitaxial growth method before or after it is planarized.

Figure 2D:
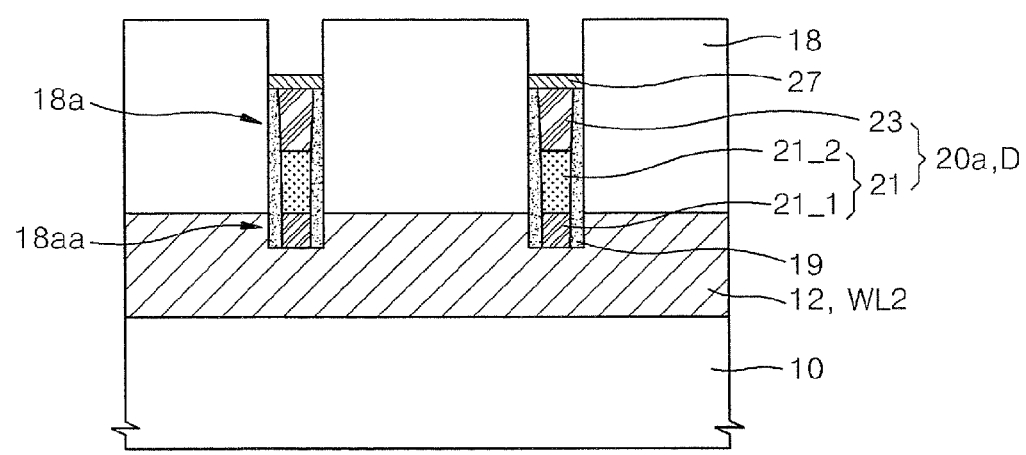
Figure 3D:
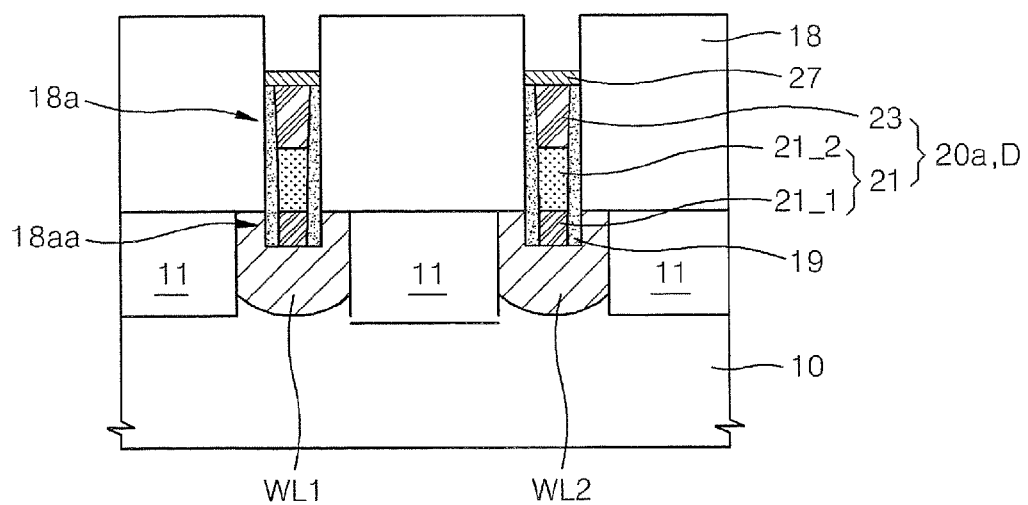

Referring to FIGS. 2D and 3D, the semiconductor patterns 20 are etched back to form recessed semiconductor patterns 20a in the cell contact holes 18a. The recessed semiconductor patterns 20a have surfaces at a lower level than the upper surface of the electrically insulating layer 18. As a result, upper regions of the cell contact holes 18a exist above the recessed semiconductor patterns 20a.

Then, first-type semiconductors 21 are formed by doping lower regions of the recessed semiconductor patterns 20a with first-type impurity ions. Before or after the first-type semiconductors 21 are formed, second-type semiconductors 23 are formed on the first-type semiconductors 21 by doping upper regions of the recessed semiconductor patterns 20a with second-type impurity ions. As a result, vertical cell diodes D are formed inside the cell contact holes 18a. Preferably, upper surfaces of the first-type semiconductors 21 are positioned at a level higher than upper surfaces of the word lines WL1 and WL2. Furthermore, lower surfaces of the first-type semiconductors 21 are in direct contact with the word lines WL1 and WL2. When the word lines WL1 and WL2 are n-type impurity regions, the first-type semiconductors 21 are n-type semiconductors and the second-type semiconductors 23 are p-type semiconductors. In this case, the first-type impurity ions may be phosphorus (P) ions, arsenic (As) ions or antimony (Sb) ions. The first-type semiconductors 21 may be first-type low-concentration semiconductors that are more lightly doped than the word lines WL1 and WL2.

In another embodiment, each of the first-type semiconductors 21 may include first-type high-concentration semiconductor 21_1 heavily doped with the first-type impurity ions and first-type low-concentration semiconductor 21_2 lightly doped with the first-type impurity ions. The first-type low-concentration semiconductor 21_2 is interposed between the first-type high-concentration semiconductor 21_1 and the second-type semiconductor 23. The upper surfaces of the first-type high-concentration semiconductors 21_1 may be formed at substantially the same level as the upper surfaces of the word lines WL1 and WL2. The impurity concentration of the first-type high-concentration semiconductor 21_1 may be substantially the same as that of the word lines WL1 and WL2.

Cell diode electrodes 27 are formed on the upper surfaces of the vertical cell diodes D (i.e., the upper surfaces of the second-type semiconductors 23). Each of the cell diode electrodes 27 may be formed of a metal silicide layer, such as cobalt silicide layer, a nickel silicide layer, or a titanium silicide layer. However, alternatively the cell diode electrodes 27 may not be formed.

Figure 2E:
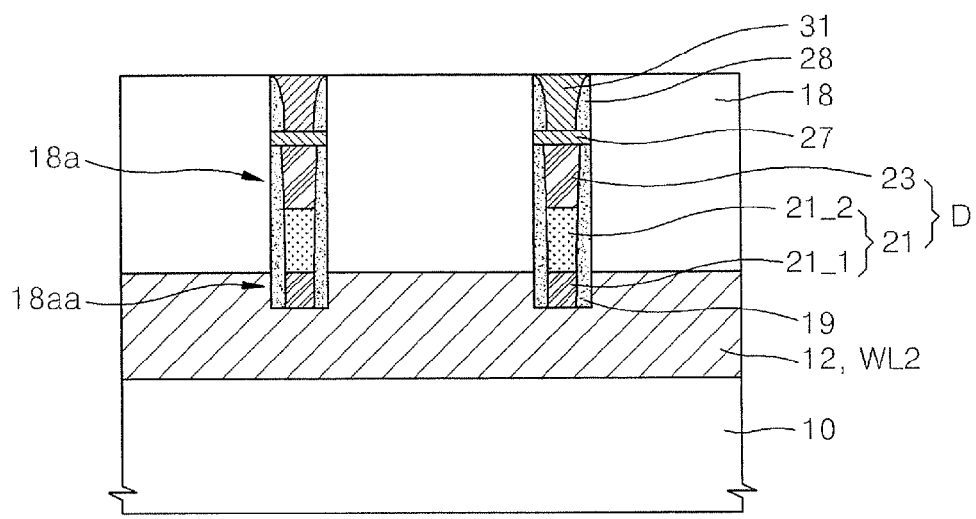
Figure 3E:
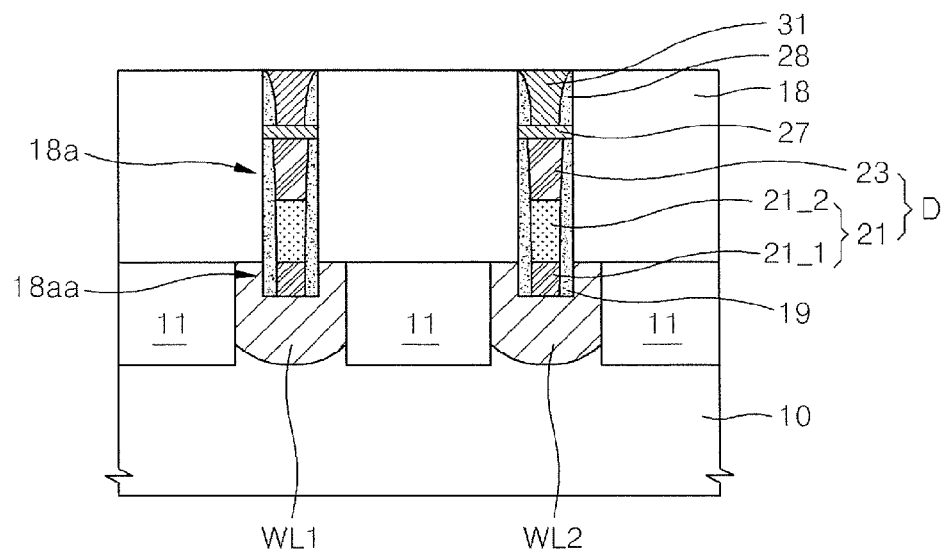

Referring to FIGS. 2E and 3E, insulating spacers 28 may be formed on the sidewalls of the upper regions of the cell contact holes 18a. Each of the insulating spacers 28 may include an insulating layer having an etch selectivity with respect to the electrically insulating layer 18. When the electrically insulating layer 18 is a silicon oxide layer, the insulating spacer 28 may be a silicon nitride layer or silicon oxynitride layer, and when the electrically insulating layer 18 is a silicon nitride layer, the insulating spacer 28 may be a silicon oxide layer. A lower electrode layer (not shown) is formed on the resultant structure having the insulating spacers 28. The lower electrode layer may be formed of a conductive layer such as a titanium nitride layer (TiN), a titanium aluminum nitride layer (TiAlN), a tantalum nitride layer (TaN), a tungsten nitride layer (WN), a molybdenum nitride layer (MoN), a niobium nitride layer (NbN), a titanium silicon nitride layer (TiSiN), a titanium boron nitride layer (TiBN), a zirconium silicon nitride layer (ZrSiN), a tungsten silicon nitride layer (WSiN), a tungsten boron nitride layer (WBN), a zirconium aluminum nitride layer (ZrAlN), a molybdenum aluminum nitride layer (MoAlN), a tantalum silicon nitride layer (TaSiN), a tantalum aluminum nitride layer (TaAlN), a titanium tungsten layer (TiW), a titanium aluminum layer (TiAl), a titanium oxynitride layer (TiON), a titanium aluminum oxynitride layer (TiAlON), a tungsten oxynitride layer (WON), or a tantalum oxynitride layer (TaON). The lower electrode layer is planarized to expose the upper surface of the electrically insulating layer 18. Accordingly, lower electrodes 31 are formed in the upper regions of the cell contact holes 18a surrounded by the insulating spacers 28.

Figure 2F:
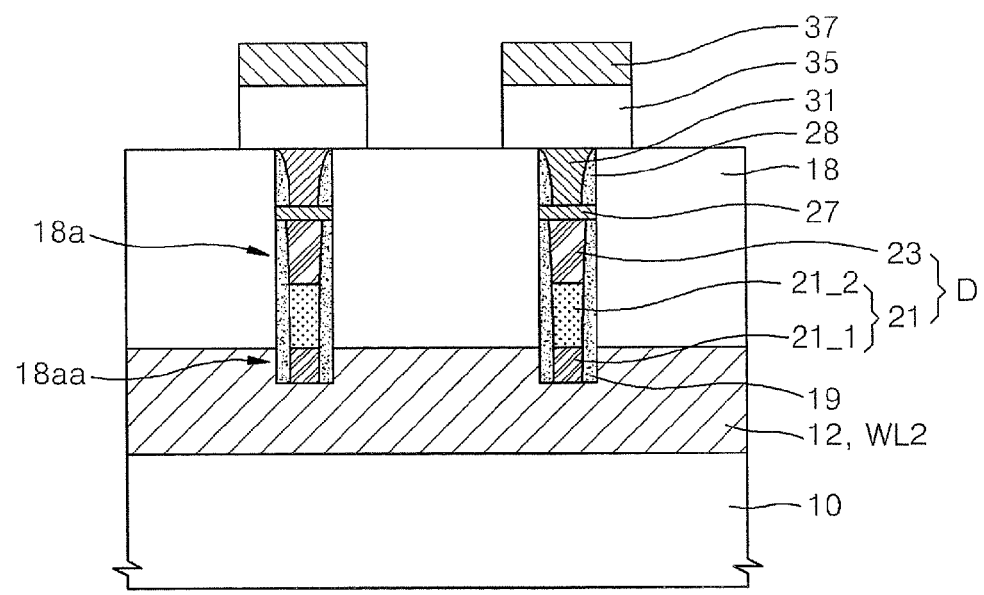
Figure 3F:
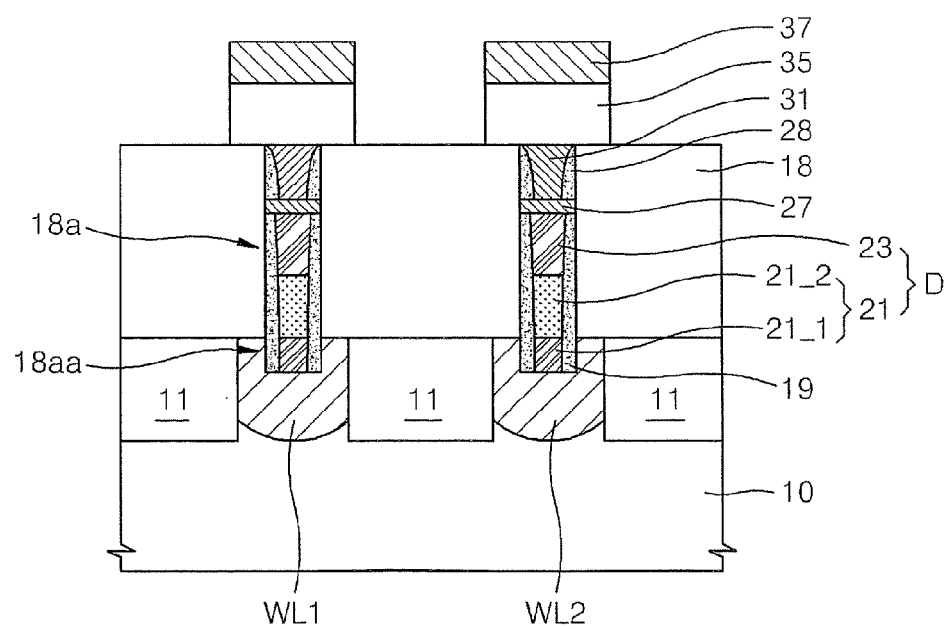

Referring to FIGS. 2F and 3F, a phase-change material layer (not shown) and an upper electrode layer (not shown) are sequentially formed on the resultant structure having the lower electrodes 31. The phase-change material layer may be formed of a chalcogenide layer such as a Ge—Sb—Te alloy layer, and the upper electrode layer may be formed of a conductive layer such as a titanium nitride layer. The upper electrode layer and the phase-change material layer are continuously patterned to form a plurality of phase-change material patterns 35 contacting the lower electrodes 31 and the upper electrodes 37 on the phase-change material patterns 35.

Figure 2G:
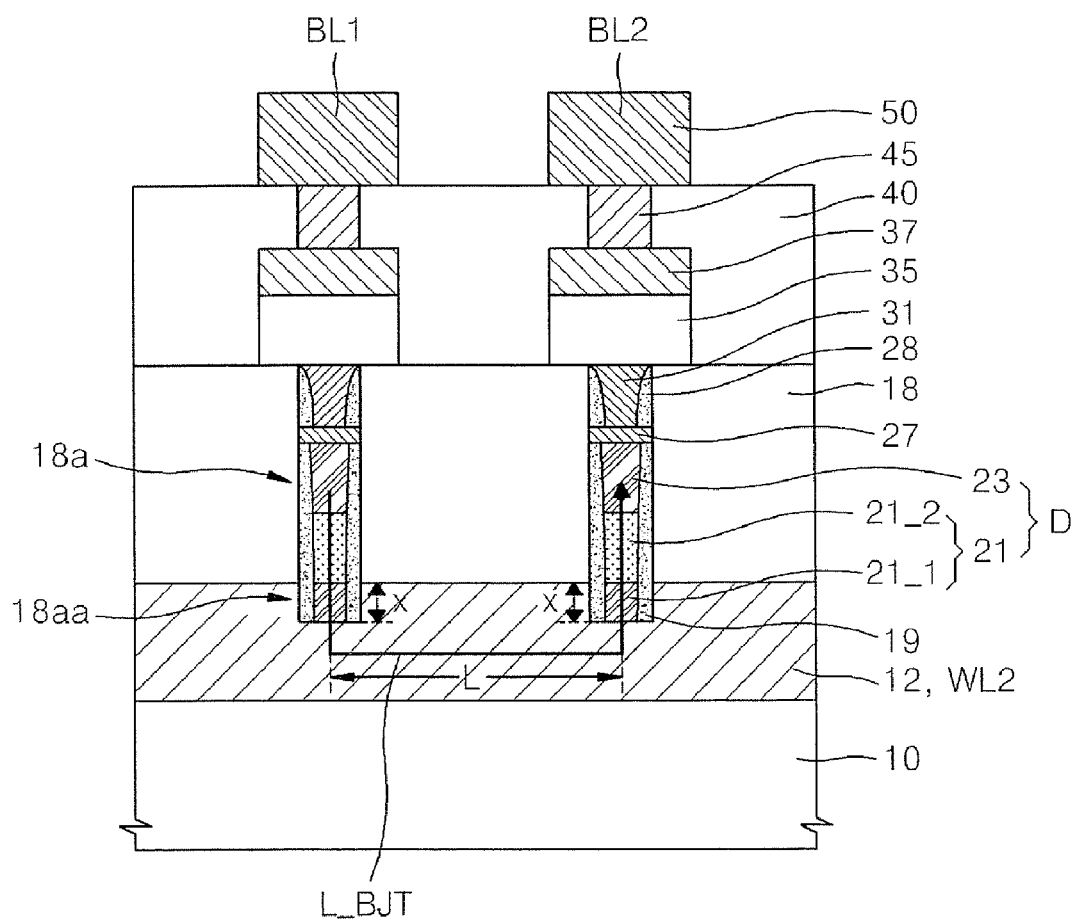
Figure 3G:
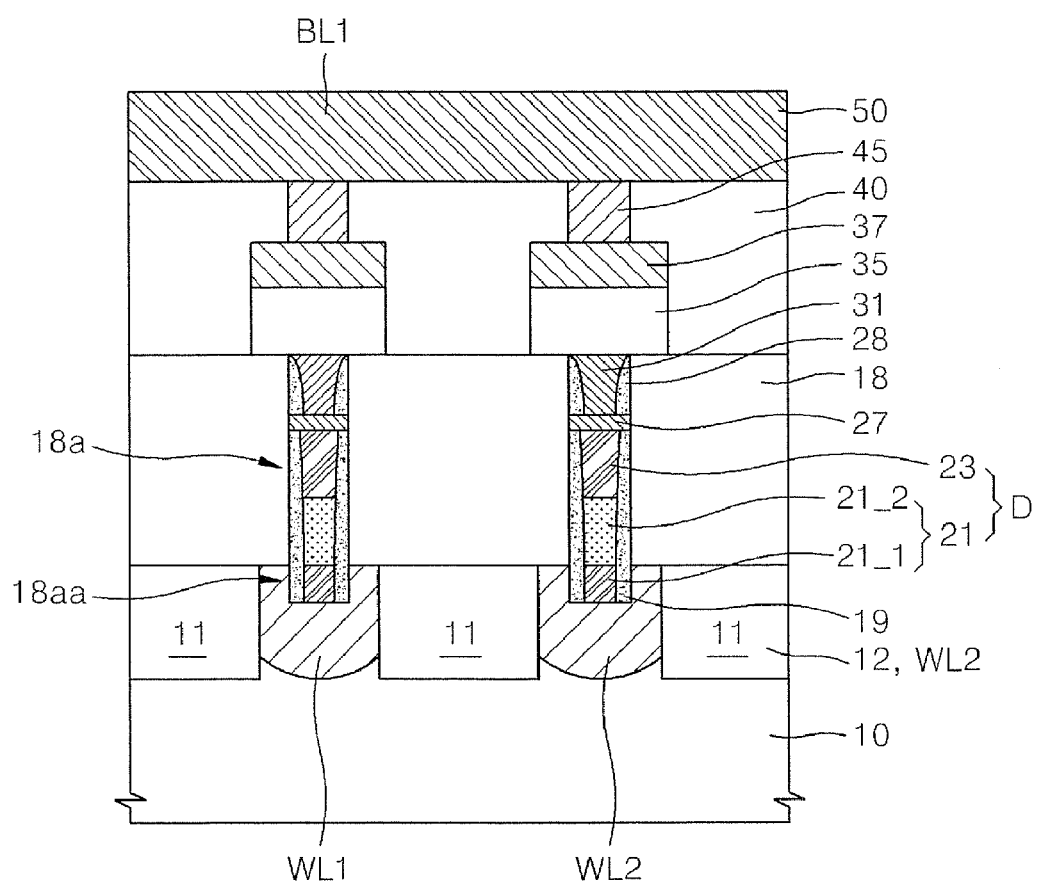

Referring to FIGS. 2G and 3G, an interlayer insulating layer 40 is formed on the resultant structure having the upper electrodes 37 and is patterned to form via holes exposing the upper electrodes 37. Contact plugs 45 are formed in the via holes, and a plurality of second signal lines (e.g., bit lines BL1 and BL2) covering the contact plugs 45 are formed.

The phase-change memory device according to an embodiment of the present invention will now be described with reference to FIGS. 1, 2G and 3G. The plurality of first signal lines (e.g., the first and second parallel word lines WL1 and WL2) is provided on the semiconductor substrate 10. The word lines WL1 and WL2 may be active regions (i.e., the first-type impurity regions doped with the first-type impurity ions). In this case, the word lines WL1 and WL2 may be electrically isolated by the isolation regions 11.

The electrically insulating layer 18 is provided on the substrate having the word lines WL1 and WL2. The cell contact holes 18a are provided which pass through the electrically insulating layer 18 and extend to the upper regions of the word lines WL1 and WL2. The upper regions of the word lines WL1 and WL2 to which the cell contact holes 18a extend are defined as the recesses 18aa.

The sidewall insulating layers 19 are disposed on the portions of the word lines WL1 and WL2 exposed by the sidewalls of the cell contact holes 18a (i.e., the sidewalls of the recesses 18aa). The sidewall insulating layers 19 may extend to be disposed on the portions of the electrically insulating layer 18 exposed by the sidewalls of the cell contact holes 18a. Each of the sidewall insulating layers 19 may be a silicon oxide layer, a silicon nitride layer, or a silicon oxynitride layer.

The vertical cell diodes D are disposed in the cell contact holes 18a having the sidewall insulating layers 19 therein. Each of the vertical cell diodes D (e.g., P-i-N diodes) may include the first-type semiconductor 21 and the second-type semiconductor 23 that are sequentially stacked. The first-type semiconductors 21 may be first-type low-concentration semiconductors that are more lightly doped than the word lines WL1 and WL2. In another embodiment, the first-type semiconductor 21 may include the first-type high-concentration semiconductor 21_1 and the first-type low-concentration semiconductor 21_2.

The vertical cell diodes D (i.e., the first-type semiconductors 21) extend into the word lines WL1 and WL2. The lower surfaces of the first-type semiconductors 21 are in direct contact with the word lines WL1 and WL2. However, in the recesses 18aa, the sidewalls of the first-type semiconductors 21 may be isolated from the word lines WL1 and WL2 by the sidewall insulating layers 19. The cell diode electrodes 27 may be provided on the upper surfaces of the vertical cell diodes D. The cell diode electrodes 27 serve to reduce resistance between the vertical cell diodes D (i.e., the second-type semiconductor 23) and the lower electrodes 31. The lower electrodes 31 are provided in the upper regions of the cell contact holes 18a on the vertical cell diodes D. The insulating spacers 28 surrounding the lower electrodes 31 may be provided on the sidewalls of upper regions of the cell contact holes 18a. The upper surfaces of the lower electrodes 31 may be at substantially the same level as the upper surface of the electrically insulating layer 18.

The phase-change material patterns 35 are formed on the lower electrodes 31. Each of the phase-change material patterns 35 may be a chalcogenide layer such as a Ge—Sb—Te alloy layer. The upper electrodes 37 are provided to the phase-change material patterns 35. Each of the upper electrodes 37 may be a conductive layer such as a titanium nitride layer.

The interlayer insulating layer 40 is provided on the substrate having the phase-change material patterns 35 and the upper electrodes 37. The plurality of the second signal lines 50 (i.e., the first and the second bit lines BL1 and BL2) is provided on the interlayer insulating layer 40. The bit lines BL1 and BL2 may be disposed to cross the word lines WL1 and WL2. Furthermore, the bit lines BL1 and BL2 may be electrically connected to the upper electrodes 37 through the contact plugs 45 passing through the interlayer insulating layer 40.

During operation of the phase-change memory device, a parasitic bipolar junction transistor L_BJT may be created between adjacent vertical cell diodes D. For example, the p-type semiconductor 23 and the n-type semiconductor 21 of one vertical cell diode D, the word line WL1 or WL2 that is the n-type impurity region, and the n-type semiconductor 21 and the p-type semiconductor 23 of an adjacent vertical cell diode D are coupled to create a parasitic p-n-p bipolar junction transistor L_BJT. In this case, the p-type semiconductors 23 correspond to an emitter and a collector, respectively, and the n-type semiconductor 21 and the word line WL1 or WL2 corresponds to a base region.

Meanwhile, the vertical cell diodes D extend into the word lines WL1 and WL2. In this case, the lower surfaces of the n-type semiconductors 21 are brought into direct contact with the word lines WL1 and WL2 and the sidewalls thereof are isolated from the word lines WL1 and WL2 by the sidewall insulating layers 19. As a result, an effective base length of the bipolar junction transistor L_BJT can be increased by as much as two times height X of the recesses 18aa compared to the case where the n-type semiconductors 21 do not extend into the word lines WL1 and WL2. This can reduce the collector current of the parasitic bipolar junction transistor L_BJT. As a result, electrical disturbance between adjacent cells can be minimized due to the reduction of effects of a parasitic bipolar junction transistor that may be created between adjacent cells.

In particular, when the n-type semiconductor 21 includes the n-type low-concentration semiconductor 21_2 and the n-type high-concentration semiconductor 21_1 is formed beneath the n-type low-concentration semiconductor 21_2, holes diffused from one of the p-type semiconductors 23 (i.e., the emitter) are more likely to be recombined with electrons in the n-type semiconductor 21 (i.e., the base) when the parasitic bipolar junction transistor L_BJT operates, thereby further reducing the collector current of the parasitic bipolar junction transistor L_BJT. Although a p-n-p bipolar junction transistor has been illustrated by way of example, it will be appreciated by those skilled in the art that the present invention may be applied to an n-p-n bipolar junction transistor.

Figure 4A:
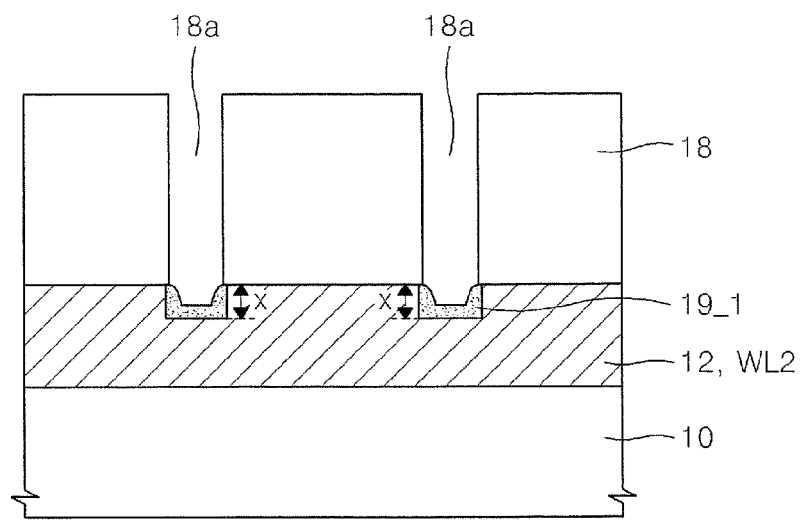
FIGS. 4A through 4C are cross-sectional views taken along line II-II of FIG. 1, illustrating a method of fabricating a phase-changeable memory device, according to another embodiment of the present invention.
Figure 4B:
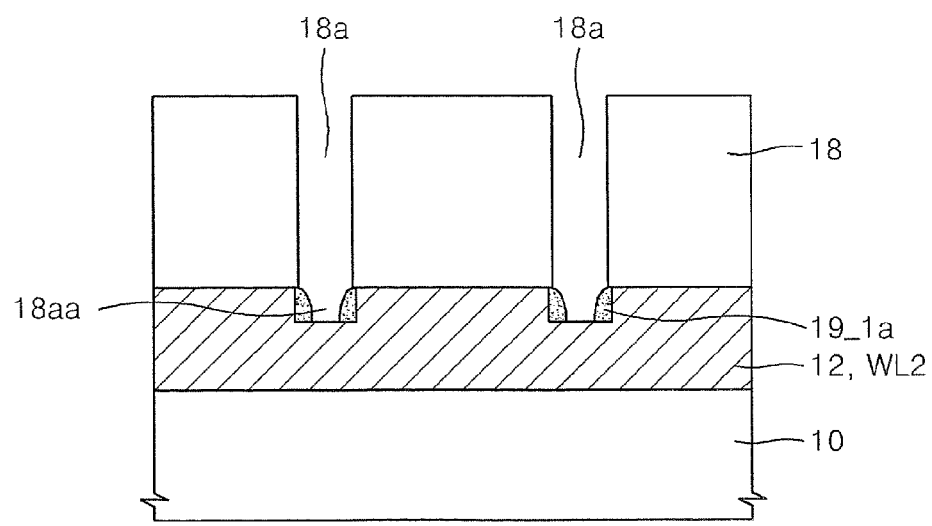
Figure 4C:
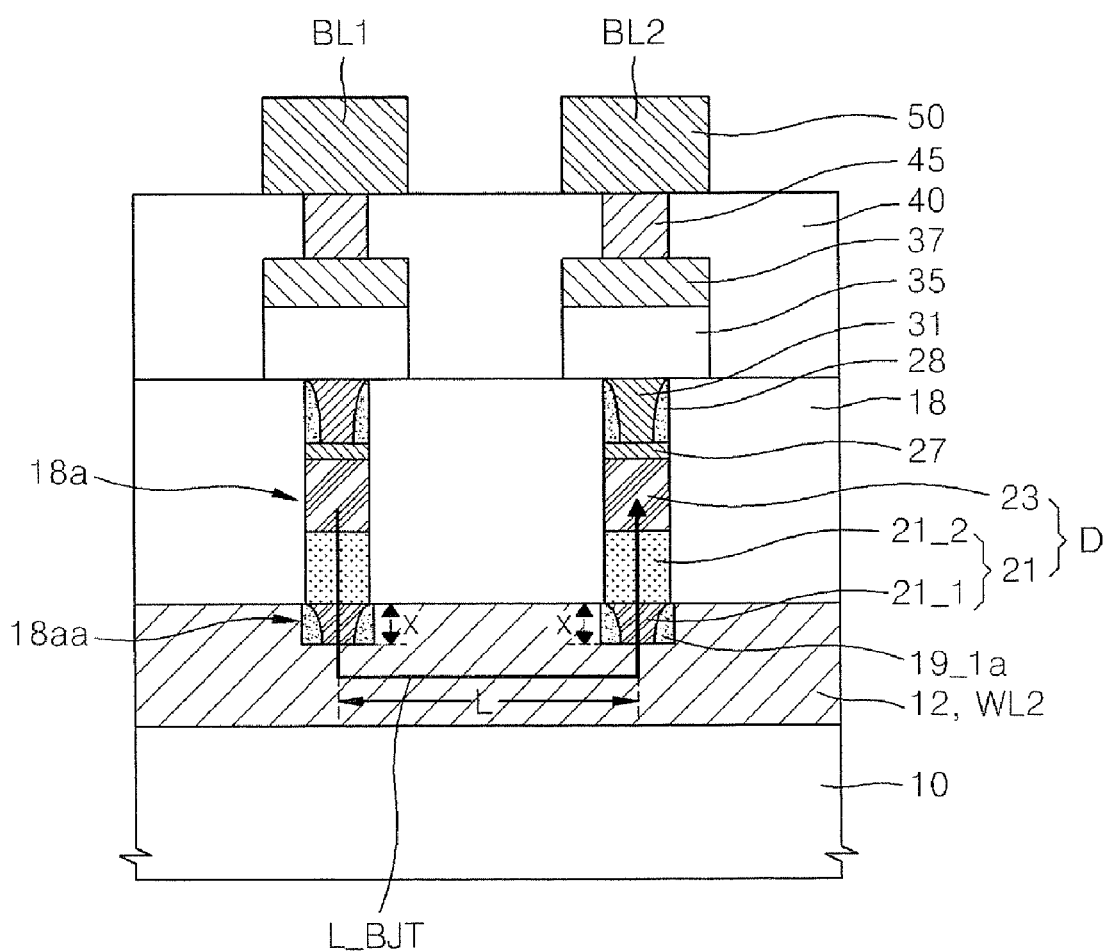

FIGS. 4A through 4C and 5A through 5C are cross-sectional views illustrating a method of fabricating a phase-change memory device according to another embodiment of the present invention. FIGS. 4A through 4C are cross-sectional views taken along line II-II of FIG. 1, and FIGS. 5A through 5C are cross-sectional views taken along line III-III of FIG. 1. The method of fabricating a phase-change memory device according to the current embodiment and a phase-change memory device fabricated using the method are similar to those described with reference to FIGS. 2A through 2G, and 3A through 3G with the exception of the following.

Figure 5A:
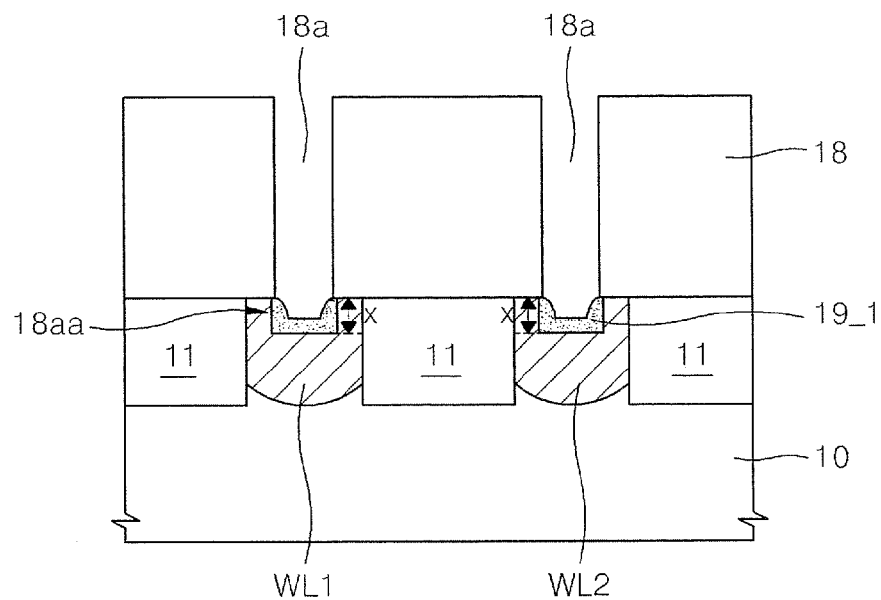
FIGS. 5A through 5C are cross-sectional views taken along line III-III of FIG. 1, illustrating a method of fabricating a phase-changeable memory device, according to another embodiment of the present invention.

Referring to FIGS. 1, 4A and 5A, an isolation region 11 is formed in a predetermined region of a semiconductor substrate 10 to define a plurality of active regions 12, and the active regions 12 are doped with dopant having a different conductivity type from the semiconductor substrate 10 to form first signal lines (i.e., first and second word lines WL1 and WL2), using the same method as that described with reference to FIGS. 2A and 2B. Furthermore, an electrically insulating layer 18 is formed on the substrate having the word lines WL1 and WL2, and cell contact holes 18a are formed which pass through the electrically insulating layer 18 and extend to upper regions of the word lines WL1 and WL2. The upper regions of the word lines WL1 and WL2 to which the cell contact holes 18a extend are defined as recesses 18aa. In this case, internal regions of the word lines WL1 and WL2 are exposed by sidewalls and bottoms of the recesses 18aa. The exposed internal regions of the word lines WL1 and WL2 in the recesses 18aa are thermally oxidized to form a thermal oxide layer 19_1 on the internal regions of the word lines WL1 and WL2.

Figure 5B:
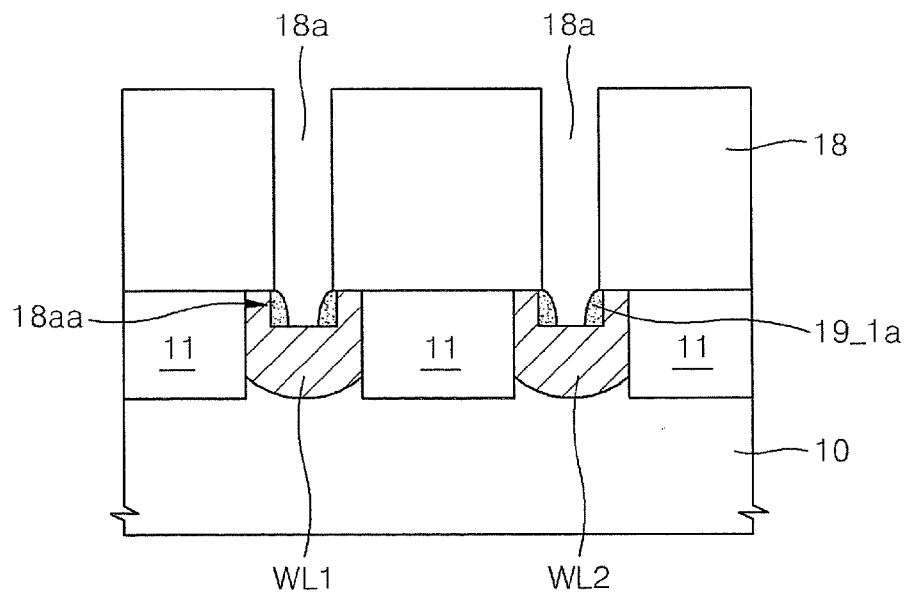
Figure 5C:
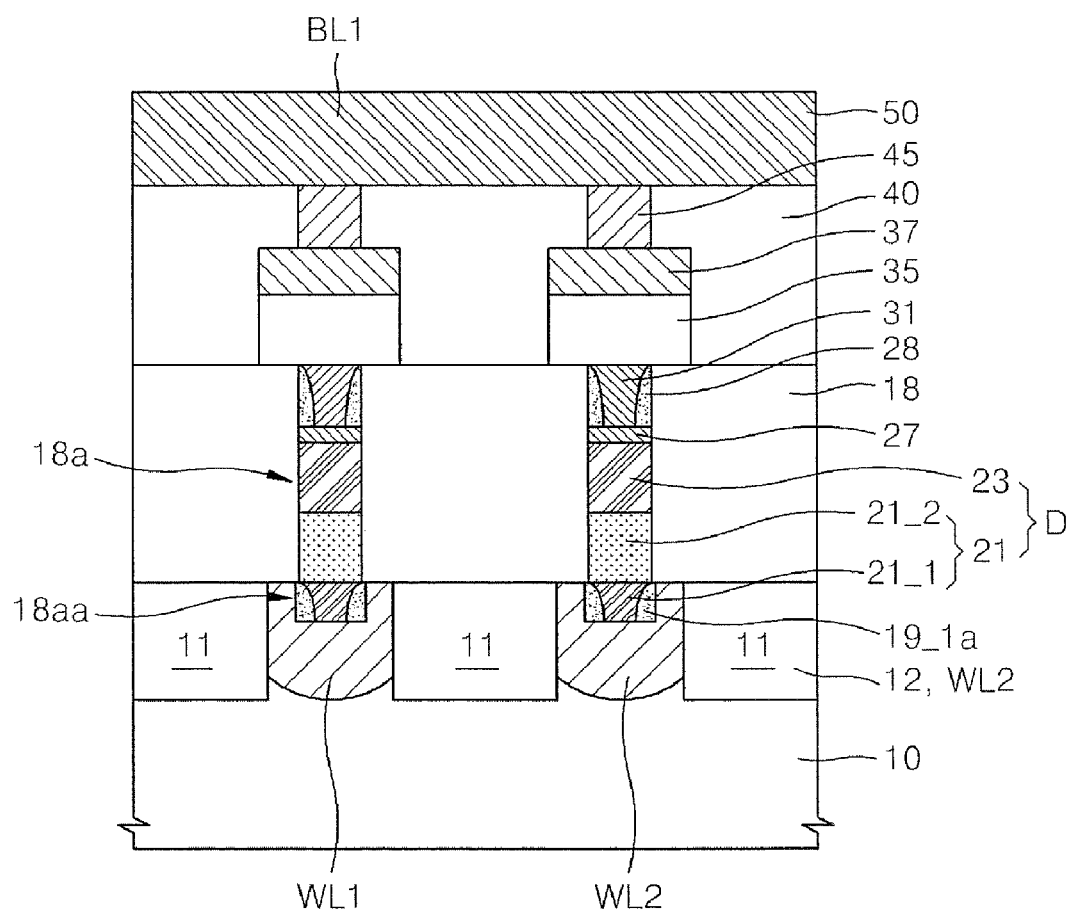

Referring to FIGS. 1, 4B and 5B, the thermal oxide layer 19_1 is anisotropically etched to form sidewall insulating layers 19_1a on the portions of the word lines WL1 and WL2 exposed by the sidewalls of the cell contact holes 18a (i.e., the sidewalls of the recess 18aa). Referring to FIGS. 1, 4C and 5C, vertical cell diodes D are formed in the cell contact holes 18a having the sidewall insulating layers 19_1a therein using the same method as that of the embodiment described with reference to FIGS. 2C through 2G and 3C through 3G. Each of the vertical cell diodes D may include a first-type semiconductor 21 and a second-type semiconductor 23 that are sequentially stacked. The first-type semiconductor 21 may be a first-type low-concentration semiconductor that is more lightly doped than the word lines WL1 and WL2. In another embodiment, the first-type semiconductor 21 may include the first-type high-concentration semiconductor 21_1 and the first-type low-concentration semiconductor 21_2.

Cell diode electrodes 27 are formed on the upper surfaces of the vertical cell diodes D (i.e., the upper surfaces) of the second-type semiconductors 23. However, alternatively the cell diode electrodes 27 may not be formed. Insulating spacers 28 may be formed on the sidewalls of upper regions of the cell contact holes 18a. Lower electrodes 31 are formed in the upper regions of the cell contact holes 18a surrounded by the insulating spacers 28. A plurality of phase-change material patterns 35 are formed covering the lower electrodes 31 and upper electrodes 37 are formed on the phase-change material patterns 35. An interlayer insulating layer 40 is formed on the resultant structure having the upper electrodes 37, and via holes exposing the upper electrodes 37 are formed in the interlayer insulating layer 40. Contact plugs 45 are formed in the via holes, and a plurality of second signal lines 50 (e.g., bit lines BL1 and BL2) are formed which cover the contact plugs 45.

In the phase-change memory device according to the current embodiment, electrical disturbance between adjacent cells can be minimized by reduction of the effect of a parasitic bipolar junction transistor that may be created between adjacent cells in operation, as in the phase-change memory device described with reference to FIGS. 2G and 3G. In detail, the vertical cell diodes D extend into the word lines WL1 and WL2. Furthermore, the lower surfaces of the first-type semiconductors 21 are brought into direct contact with the word lines WL1 and WL2 and the sidewalls thereof are isolated from the word lines WL1 and WL2 by the sidewall insulating layers 19_1a. In this case, an extending length of the first-type semiconductors 21 into the word lines WL1 and WL2 is X, an effective base length of the bipolar junction transistor L_BJT can be increased by as much as two times X compared to the case where the first-type semiconductors 21 do not extend into the word lines WL1 and WL2. This can reduce collector current of a parasitic bipolar junction transistor L_BJT.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An integrated circuit memory cell, comprising:
    a substrate having a first semiconductor region of first conductivity type therein that forms a P-N junction with an underlying portion of said substrate;
    an electrically insulating layer on said substrate, said electrically insulating layer having an opening therein that extends opposite a recess in the first semiconductor region;
    a first insulating spacer on a sidewall of the recess in the first semiconductor region;
    a diode in the opening, said diode having a first terminal electrically coupled to a bottom of the recess in the first semiconductor region; and
    a variable resistivity material region electrically coupled to a second terminal of said diode.

2. The memory cell of claim 1, wherein the variable resistivity material region is a phase-changeable material region.

3. The memory cell of claim 1, wherein the first semiconductor region is configured as a word line.

4. The memory cell of claim 1, wherein said diode is a P-N junction diode having a cathode of first conductivity type electrically connected to the first semiconductor region and an anode of second conductivity type electrically coupled to said variable resistivity material region.

5. The memory cell of claim 4, wherein the cathode forms a non-rectifying junction with a bottom of the recess in the first semiconductor region.

6. The memory cell of claim 5, further comprising a lower electrode electrically contacting the phase-changeable material region, in the opening.

7. The memory cell of claim 6, further comprising an upper electrode electrically contacting the phase-changeable material region and a bit line electrically coupled to said upper electrode.

8. The memory cell of claim 7, wherein the phase-changeable material region is disposed on an upper surface of the electrically insulating layer.

9. The memory cell of claim 6, further comprising a second insulating spacer extending between the lower electrode and a sidewall of the opening.

10. The memory cell of claim 1, wherein said diode is a P-i-N diode.

11. The memory cell of claim 1, further comprising:
an interlayer insulating layer having a bit line contact opening therein, on said variable resistivity material region;
a contact plug that extends in said bit line contact opening and is electrically coupled to said variable resistivity material region; and
a bit line electrically coupled to said contact plug.

12. An integrated circuit memory cell, comprising
a substrate having a first semiconductor region of first conductivity type therein;
an electrically insulating layer on said substrate, said electrically insulating layer having an opening therein that extends opposite a recess in the first semiconductor region;
a first insulating spacer on a sidewall of the recess in the first semiconductor region;
a diode in the opening, said diode having a first terminal electrically coupled to a bottom of the recess in the first semiconductor region;
variable resistivity material region electrically coupled to a second terminal of said diode; and
wherein the electrically insulating layer and the first insulating spacer are formed of different dielectric materials.

13. A phase-change memory device comprising:
a signal line that is a first-type impurity region disposed on a semiconductor substrate;
an electrically insulating layer formed on the substrate having the signal line;
a cell contact hole passing through the electrically insulating layer and extending to an upper region of the signal line;
a sidewall insulating layer formed on portions of the signal line exposed by sidewalls of the cell contact hole;
a vertical cell diode disposed in a lower region of the cell contact hole having the sidewall insulating layer therein, the vertical cell diode including a first-type high-concentration semiconductor, a first-type low-concentration semiconductor, and a second-type semiconductor, which are sequentially stacked;
a lower electrode disposed in an upper region of the cell contact hole, the lower electrode being electrically connected to the vertical cell diode;
a phase-change material pattern disposed on the electrically insulating layer covering the lower electrode; and
an upper electrode disposed on the phase-change material pattern.

14. The device of claim 13, wherein the sidewall insulating layer extends to be disposed on portions of the electrically insulating layer exposed by the sidewalls of the cell contact hole.

15. The device of claim 13, wherein the sidewall insulating layer is a thermal oxide layer.

16. The device of claim 13, wherein the first-type impurity region is an n-type impurity region, the first-type high-concentration semiconductor is an n-type high-concentration semiconductor, the first-type low-concentration semiconductor is an n-type low-concentration semiconductor, and the second-type semiconductor is a p-type semiconductor.

17. The device of claim 13, further comprising an insulating spacer formed on sidewalls of the upper region of the cell contact hole and surrounding the lower electrode.

18. An integrated circuit memory cell, comprising:
a semiconductor substrate of second conductivity type having a semiconductor word line of first conductivity type thereon that forms a P-N rectifying junction with said semiconductor substrate;
an electrically insulating layer on the word line, said electrically insulating layer having an opening therein aligned with a recess in the word line, said recess having a bottom extending below an interface between said electrically insulating layer and an upper surface of the word line;
an electrically insulating spacer on a sidewall of the recess, said electrically insulating spacer and said electrically insulating layer comprising different materials;
a diode in the opening in said electrically insulating layer, said diode having a first terminal electrically coupled to a bottom of the recess in said word line; and
a variable resistivity material region electrically coupled to a second terminal of said diode.

* * * * *